(12) United States Patent
Shelton et al.

(10) Patent No.: US 7,968,806 B2
(45) Date of Patent: Jun. 28, 2011

(54) MULTI-VOLTAGE HOUSING

(75) Inventors: Mark Shelton, Sherwood, OR (US);
Marc Bowman, Portland, OR (US); Jim Bernklau, Tigard, OR (US); Jeff Stone, Portland, OR (US); Roger McCoy, Portland, OR (US)

(73) Assignee: Veris Industries, LLC, Portland, OR (US)

( * ) Notice: Subject to any disclaimer, the term of this patent is extended or adjusted under 35 U.S.C. 154(b) by 461 days.

(21) Appl. No.: 12/220,409

(22) Filed: Jul. 23, 2008

(65) Prior Publication Data

US 2009/0065247 A1    Mar. 12, 2009

Related U.S. Application Data

(60) Provisional application No. 60/993,225, filed on Sep. 10, 2007.

(51) Int. Cl.
*H05K 5/00* (2006.01)

(52) U.S. Cl. .............. 174/520; 174/50; 174/66; 174/67; 220/3.2; 220/241; 220/242

(58) Field of Classification Search .................... 174/50, 174/53, 520, 66, 67, 57, 58, 487, 488, 489; 220/3.2–3.9, 4.02, 241, 242; 439/535, 536; 52/220.1, 220.3, 220.7, 220.8
See application file for complete search history.

(56) References Cited

U.S. PATENT DOCUMENTS

| 3,371,149 | A | * | 2/1968 | Maxted ........................... 174/53 |
| 4,245,184 | A | | 1/1981 | Billings et al. |
| 4,333,122 | A | | 6/1982 | Hayden et al. |
| 4,433,204 | A | * | 2/1984 | Wuertz .......................... 174/53 |
| 4,536,612 | A | * | 8/1985 | Domigan ...................... 174/489 |
| 4,685,022 | A | | 8/1987 | Nichols et al. |
| 4,851,803 | A | | 7/1989 | Hahn |
| 5,177,325 | A | * | 1/1993 | Giammanco .................. 174/50 |
| 5,796,037 | A | * | 8/1998 | Young et al. ................... 174/50 |
| 5,808,846 | A | | 9/1998 | Holce et al. |
| 6,018,239 | A | | 1/2000 | Berkcan et al. |
| 6,037,541 | A | * | 3/2000 | Bartley et al. .................. 174/66 |
| 6,104,583 | A | | 8/2000 | Wynn et al. |
| 6,395,978 | B1 | * | 5/2002 | Whitehead et al. ............ 174/50 |
| 6,437,954 | B1 | | 8/2002 | Harr |
| 6,635,821 | B2 | * | 10/2003 | Loeffelholz et al. ........... 174/53 |
| 6,653,561 | B2 | * | 11/2003 | Lalancette et al. ............. 174/50 |
| 6,950,292 | B2 | | 9/2005 | Holce et al. |

* cited by examiner

*Primary Examiner* — Angel R Estrada
(74) *Attorney, Agent, or Firm* — Chernoff, Vilhauer, McClung & Stenzel

(57) ABSTRACT

A housing for one or more electrical components that are connected to sources of a plurality of voltages comprises a box, a first cover to cover a first portion of the opening in the box and a second cover to cover a second portion of the opening. The first cover includes a separator that projects into the box when the first cover is installed to divide the interior of the box and so that components connectable to a higher voltage can be separated from components connectable to a lower voltage.

17 Claims, 4 Drawing Sheets

US 7,968,806 B2

MULTI-VOLTAGE HOUSING

CROSS-REFERENCE TO RELATED APPLICATIONS

This application claims the benefit of U.S. Provisional App. No. 60/993,225, filed Sep. 10, 2007.

BACKGROUND OF THE INVENTION

The present invention relates to a housing for electrical components and, more specifically, to a housing for one or more electrical components that are connected to sources of a plurality of voltages.

Automation and remote monitoring and control are continuing trends in industrial environments. For example, referring to FIG. 1, in an automated or remotely controlled system 20, a computer or other controller 22, responding to particular input conditions, typically outputs a low voltage, digital control signal 24 to control the operation of a remotely located load 26. The digital control signal is commonly a few milli-amps of current at 5-25 volts (v) ac/dc while the load is typically connected to a source 28 of 120 or more volts, 60 Hertz (Hz) ac electrical power and may draw considerable current while in operation. A pair of relays, typically, provides the means for controlling the connection of the higher voltage to the load with a lower voltage, low current control signal.

The control signal 24 output by the controller is input to a control relay 30, commonly a solid state switching device, that, in turn, controls conduction of an input or "coil" voltage 32 to a load relay 34. In the exemplary control circuit, the control relay 30 comprises an opto-isolator. The control signal is communicated to a light emitting diode (LED) 36 in the opto-isolator. When the control voltage is present, the LED emits light causing a photo-transistor 38 in the opto-isolator to conduct the load relay coil voltage, typically, 10-30 v. dc, from the controller or another source to the load relay. When the control signal is not present, the LED does not emit light and the photo-transistor does not conduct the coil voltage to the load relay.

The application of coil voltage to the input or coil 40 of the load relay causes a change in the conductive state of the load relay's main contacts 42, 44. The exemplary load relay 34 includes both normally open 44 and normally closed 42 main contacts and the logic of the circuit can be altered by changing the connection of a conductor connecting the load relay and the load. Closure of the normally open main contacts in response to the presence of a control signal connects the load to its source of power. Conversely, when the control signal is not present, the phototransistor 38 does not conduct causing the conduction state of the load relay's main terminals to be switched to the normal state, for purposes of the example, the open state, disconnecting the load from its source of power.

Referring also to FIG. 2, to reduce the complexity of constructing and servicing systems that utilize multiple voltages, such as a remote control or monitoring circuit, it is desirable to locate circuit components that are connected to the circuit's lower voltage(s) and circuit components connected to the circuit's higher voltage(s) in a single housing 50. For example, the number of devices that must be separately mounted during installation of the exemplary remote control circuit can be significantly reduced by purchasing a housing in which the control relay 30, the load relay 34 and a load switch 52, enabling manual or automated control of the load, are pre-installed. In addition, the components installed in the housing are typically pre-wired so that the installer need only to make the external connections to the controller, the source of load relay coil voltage, the load and the source of power for the load. Similarly, if service is necessary, the presence of the three components in a single location simplifies testing by eliminating long wire runs connecting separately mounted components.

The housing 50 comprises a box portion 54 and a cover 56 that is securable to the box with a plurality of screws 58. The housing typically includes a plurality of apertures through which the lower voltage conductors, for example, the conductors for the control signal and the load relay coil voltage, and the higher voltage conductors, for example, the conductors for the load current, can be introduced to the housing. One of the apertures 60, commonly the aperture for the load current conductors, is often aligned with the center of a projecting, externally threaded conduit nipple 62 that is affixed to the box portion of the housing. The housing can be mounted on another electrical enclosure 64 by inserting the nipple into an aperture in the other enclosure and securing the nipple and the housing with a conduit nut 66. Additional apertures are provided in the housing to accept threaded conduit connectors 68, 70 through which the control signal conductors and the load relay coil voltage conductors can be introduced to the housing.

While locating components that are connected to lower voltage(s) and components that are connected to higher voltage(s) in the same housing can simplify installation and service of circuits such as a remote monitoring and control circuit, electrical codes require that the housing be treated as an enclosure for conductors of the highest voltage unless the conductors of lower voltage(s) are physically separated from the higher voltage conductors. It is often desirable to have installation and service of the low voltage portions of a circuit, for example the control portion of the remote control circuit, performed by a computer or control technician. However, electrical codes require the work to be performed by a licensed electrician if a conductor in an enclosure is connected to source of voltage exceeding 42.4 v.

To enable computer and other technicians to install and service the lower voltage contents of a multi-voltage housing, the housing is typically separated into two compartments by a dielectric barrier 72. The insulating barrier commonly comprises fibrous material, typically paper, that is bent to form a first portion 74 that extends substantially parallel to the exposed edge of the box portion of the housing to cover the load relay, the load switch and the higher voltage conductors when the housing's cover 56 is removed. The insulating barrier also comprises a second portion 76 that extends substantially normal to the first portion and into the opening in the box for a substantial portion of the box's depth to separate the higher voltage contents of the box from the lower voltage contents.

The insulating barrier reduces the likelihood of inadvertent contact with the higher voltage and the possibility of injury while working on the lower voltage portion of the circuit. However, while fitting snuggly in the box portion the insulating barrier is retained in the box by friction and can be easily removed or even dislodged from the box by inadvertent contact during work on the lower voltage contents of the box. In addition, the wiring that connects the control relay and the load relay passes under the edge of the projecting portion 76 of the insulating barrier and movement of the wires may dislodge the barrier. The insulating barrier is a loose piece and once removed from the box, either intentionally or inadvertently, can be easily misplaced and not reinstalled. Further, when the cover has been installed it is not possible to determine if the insulating barrier has been installed without removing the cover of the housing, increasing the likelihood that a person attempting to service the low voltage portion of the contents of the box will, upon removing the cover, discover that the insulating barrier has been removed and attempt to perform the work in the housing without the barrier being in place.

What is desired, therefore, is a housing for electrical components providing a secure division of the housing enabling secure separation of contents connectable to lower voltage(s) and contents connectable to higher voltage(s).

DETAILED DESCRIPTION OF PREFERRED EMBODIMENTS

Figure 3:
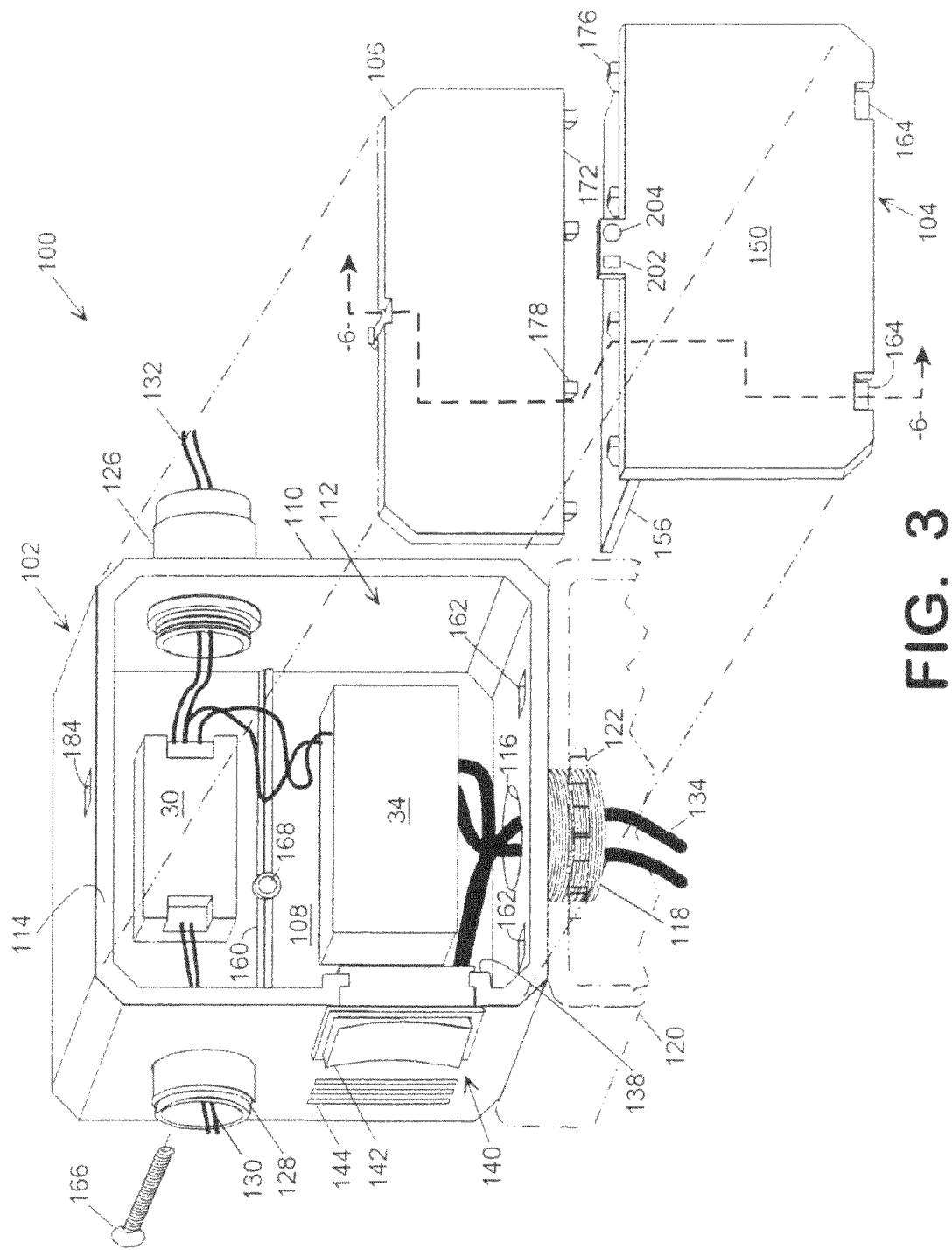
FIG. 3 is a perspective illustration of an exemplary improved multi-voltage housing for electrical components.

Referring in detail to the drawings where similar parts are identified by like reference numerals, and, more particularly to FIG. 3, the improved multi-voltage electrical housing 100 comprises, generally, a box portion 102, a first cover 104 and a second cover 106. The box typically comprises a base 108 from which a wall 110 projects to define an opening 112 that extends for a depth from the interior surface of the base to lip of the box, the exposed edge 114 of the wall. The interior surface of the base is generally co-extensive with the opening to substantially cover the opening at the end of the wall opposite the exposed edge 114. Commonly, the wall is generally co-extensive with the perimeter of the base but the wall may define an opening of any shape and size without regard to the size and shape of the exterior surface of the base. The box of the housing illustrated in FIG. 3 is generally square in the plan view but could be round, octagon or any other shape. Likewise, while the housing could be any size, the plan dimensions of the box are preferably at least approximately the dimensions of a double gang junction box so that the housing has sufficient volume for the plurality of conductors common to multi-voltage circuits such as remote control circuit of FIG. 1. The housing comprises a material that is typically used in the manufacture of junction boxes and other enclosures for electrical apparatus, including metal or a combination of metal and a dielectric material, but preferably comprises a plastic.

Figure 1:
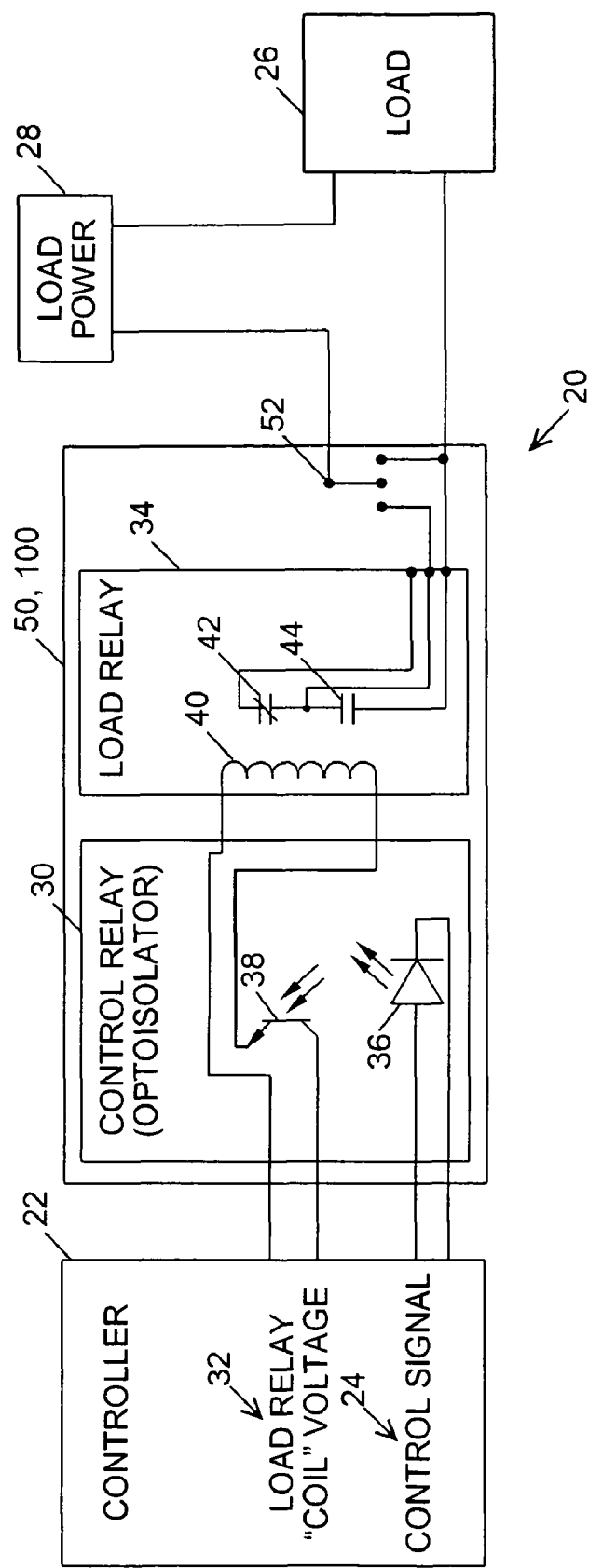
FIG. 1 is a schematic illustration of an exemplary remote control circuit.
Figure 2:
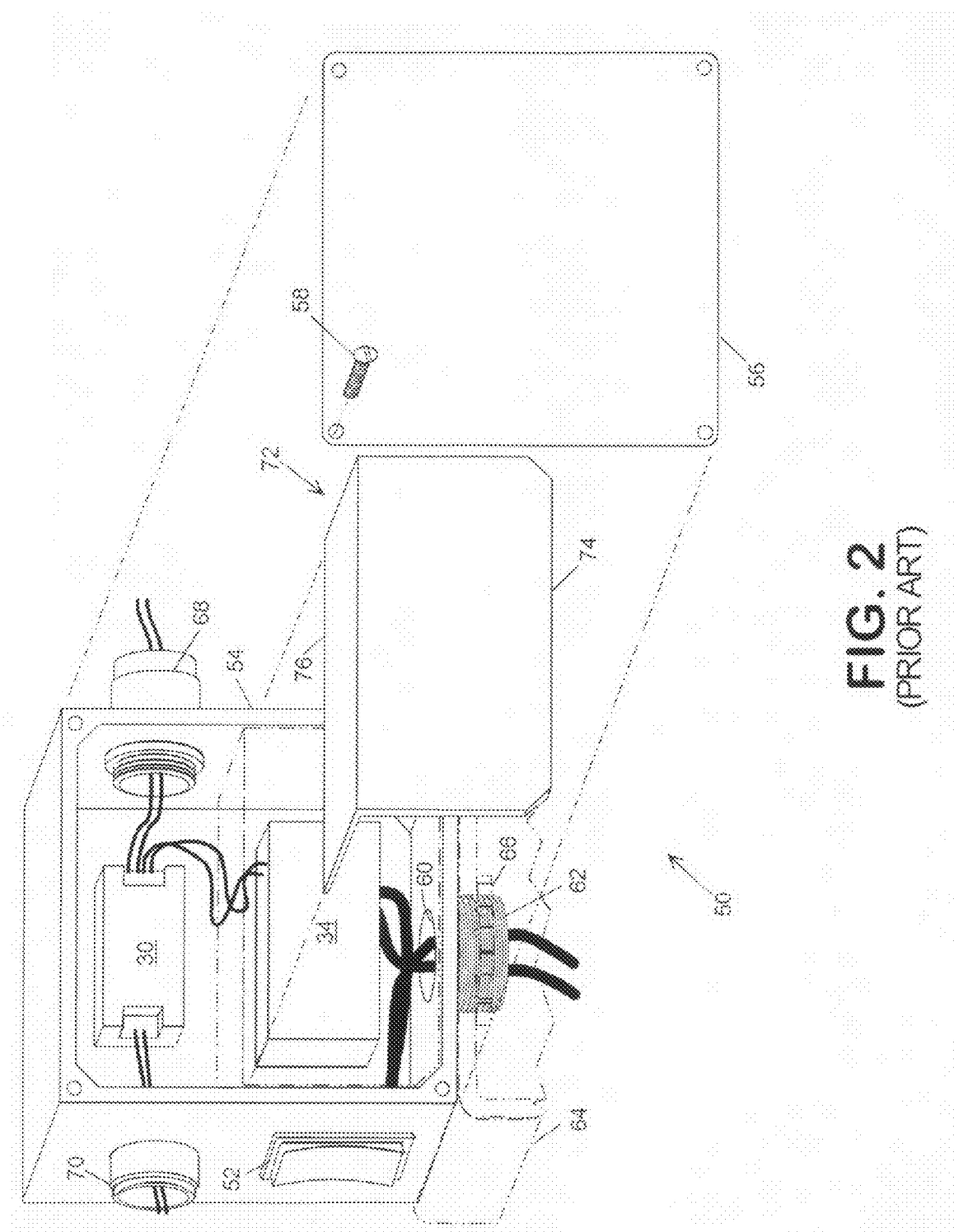
FIG. 2 is a perspective illustration of a prior art housing for electrical components connectable to multiple voltages.

The contents of the multi-voltage housing typically comprises one or more electrical devices, such as the control relay 30 of a remote monitoring or control circuit, as illustrated in FIG. 1, which is to be connected to a source(s) of one or more lower voltages, such as the control signal 24 and the load relay coil voltage 32, and one or more electrical devices, such as the load relay 34, that is to be connected to a source of higher voltage. The lower voltage device is typically attached to the interior surface of the base of the box adjacent to the wall proximate one side of the opening. The higher voltage device is preferably attached to the base of the box adjacent the wall on the opposite side of the opening from the location of the lower voltage component.

The wall of the box preferably defines a plurality of apertures through which the lower voltage conductors and the higher voltage conductors can be introduced to the housing. An aperture 116 may be aligned with the center of an externally threaded conduit nipple 118 that projects from the exterior surface of the wall of the box. The projecting conduit nipple enables securing the box to another electrical enclosure 120, such as a junction box, by inserting the nipple into a "knock out" aperture in the other enclosure and securing the nipple and the box with a conduit nut 122. Other apertures 124 in the box are typically appropriately sized to accept threaded conduit connectors 126, 128 enabling conduit, through which additional electrical conductors pass, to be secured to the box. In the exemplary multi-voltage housing 100, the lower voltage control signal conductors 130 and the load relay coil voltage conductors 132 pass through conduit connectors secured to the wall and connect with the control relay and higher voltage conductors 134 connectable to the load and the load power source are introduced to the interior of the box through the aperture in the projecting conduit nipple.

Figure 4:
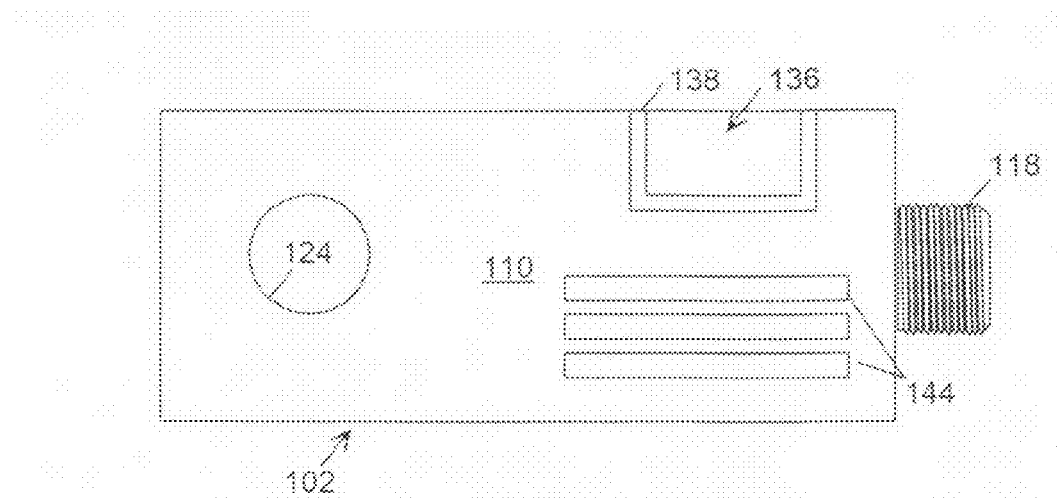
FIG. 4 is an elevation view of a box portion of the improved multi-voltage housing of FIG. 3.

In the exemplary remote control circuit, a three position manual switch 52 is interconnected with the load current conductors enabling a user to disconnect the load from its power source, manually operate the load or select remote operation of the load via the load relay. Referring also to FIG. 4, the wall 110 of the exemplary box portion of the multi-voltage housing defines an embrasure 136 and a ledge 138 that extends along the periphery of the embrasure. An electrical component, such as a three position manual switch 140, having a groove along at least three sides of its body that corresponds to the ledge can be slid into the embrasure and into engagement with the wall. When the housing's cover is installed on the box, the interlocking ledge and groove and a portion of the cover restrains the device in the embrasure in the wall. By locating a device, such as the switch 140, in the wall of the box with its actuator 142 aligned substantially normal to the direction that persons or objects commonly approach the housing, the likelihood of inadvertent actuation of the switch is reduced.

Optionally, the wall may define one or more apertures 144 comprising a grill for ventilating the interior of the box portion.

Figure 6:
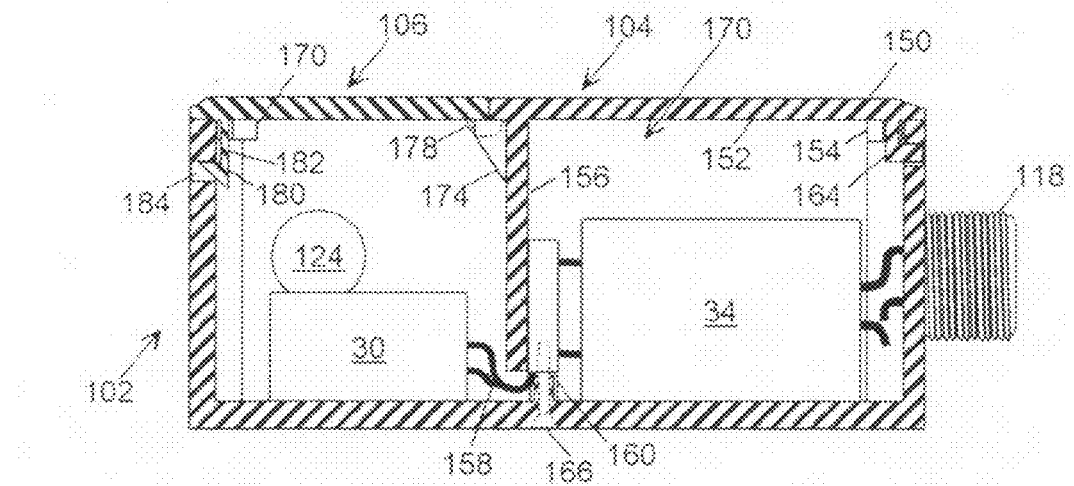
FIG. 6 is a section view of the exemplary improved multi-voltage housing of FIG. 3 along line 6-6.

The cover for the improved multi-voltage housing comprises a first cover portion 104 and a second cover portion 106. The first cover 104 includes a first, generally planar lid portion 150 having an interior surface 152 that is arranged to engage the exposed edge of the wall of the box and cover a first portion of the opening in the box that is defined by the wall. The lid portion of the first cover may include a curb 154 that is arranged to engage a portion of the interior surface of the wall to aid in positioning the first cover on the box. The first cover also comprises a second, generally planar separator 156 that projects generally normal to the inner surface of the lid portion. Referring also to FIG. 6, when the first cover is in place on the edge of the wall, the separator extends downward for a substantial portion of the depth of the wall to divide the interior space of the box enabling separation of the contents, and more specifically separation of the contents connected to the higher voltage from the contents connected to the lower voltage.

Typically, the separator of the first cover does not extend completely to the base of the box. The edge of the separator distal of the lid and the interior surface of the base define an aperture 158 through which lower voltage conductors, for example, the load relay coil voltage conductors, can be routed to connect an electrical apparatus on one side of the separator to an electrical apparatus on other side of the separator. However, it is preferable to minimize the height of the aperture between the base and the edge of the separator to reduce the chance that objects, such as tools, can migrate from one side of the separator to the other side. To further, minimize the possibility of migration of small objects from the lower voltage side of the separator to the higher voltage side of the separator, a ridge 160 that extends substantially parallel to the separator but which is offset from the separator projects upward from the interior surface of the base. The low voltage conductors can pass under the edge of the separator and over the ridge, but it is highly unlikely that a loose object on the low voltage side of the separator will be able to pass through the labyrinth created by the separator and the projecting ridge.

The wall of the box of the multi-voltage housing defines a plurality of apertures 162 that are engageable by corresponding hooks 164 that extend from the inner surface of the lid portion of the first cover 104. Engagement of the hooks with edges of the corresponding apertures in the wall of the box, secures one edge of the first cover relative to the wall. The first cover is preferably further secured to the box with a screw 166 having a head that bears on the outside surface of the base and a threaded portion that passes through an aperture 168 defined by the base and is arranged to be threaded into engagement with the separator of the first cover which is located proximate an edge of the first cover distal of the hooks 164. When the first cover is secured to the box, the separator divides the interior of the box providing a secure enclosure 170 within the box to separate the contents of the box, for example, the electrical devices that are connected to the higher voltage. The enclosure 170 can be opened with deliberate effort, the application of a tool, a screwdriver, to the reverse side of the housing but cannot be inadvertently dislodged while working on the lower voltage side of the separator. Moreover, since the first cover is securable to the box independent of the installation of the second cover, proper separation of the higher and lower voltage contents of the box is easily determined by observation of the presence of the first cover on the box portion of the multi-voltage housing.

Figure 5:
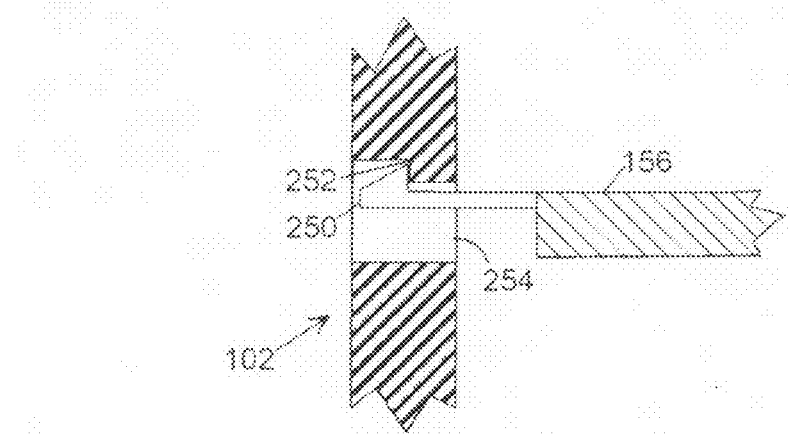
FIG. 5 is a partial section view of an alternative apparatus for securing a cover of a multi-voltage housing.

Referring to FIG. 5, an alternative mechanism for securing the second edge of the first cover to the box of the multi-voltage housing comprises a flexible hook member 250 projecting from the edge of separator 156 into selective engagement with a portion of the base 102 defining a stepped edge 252 of an aperture 254. As the first cover is pressed toward engagement with the edge of the wall, the end of the hook interferes with the wall of the aperture elastically deforming the flexible separator to which the hook is affixed. When the hook is moves past the stepped edge 252 in the aperture, the flexible separator elastically rebounds causing the surface of the hook to engage the surface of the step and secure the first cover to the box. The hook may be disengaged from the step surface and the first cover removed by reaching around the housing and inserting a tool between the hook and the side of the aperture. Alternatively, the first cover may be removed by exerting sufficient force on the separator to disengage the hook from the surface of the step in the aperture.

The lid portion of the first cover 104 to the multi-voltage housing includes portions defining a plurality of apertures 202, 204 to receive status indicators, typically LEDs, to indicate the operation of the contents of the housing. Typically, the housing is mounted with the covers facing the direction from which persons are most likely to approach making status indicators mounted in the cover of the housing more easily observed than status indicators mounted in the wall of the housing. Since the status indicators are mounted in the first cover, they can remain functional while the lower voltage, logic portion of the circuit is inspected. The apertures 202, 204 for the status indicator LEDs differ in shape making it easy to determine which indicator is illuminated.

The second portion of the housing's cover 106 comprises a generally planar inner surface arranged to engage the edge of the wall and which is substantially coextensive with the portion of the opening in the box not covered by the first cover. A curb 170, projecting from the inner surface and arranged to engage a portion of the inner surface of the wall, aids in locating the cover on the box. The second cover generally abuts the first cover along the edge 172 most central over the opening and movement of the second cover relative to the first cover is limited a plurality of interlocking surfaces along the abutting edges of the two cover portions. The edge 172 of the second cover is arranged to abut a corresponding edge of a portion of the lid of the first cover that projects beyond the separator. The separator 156 of the first cover 104 includes a plurality of projections 174, each comprising a surface 176 that is arranged to engage the inner surface of the second cover proximate the abutting edge and support the abutting edge of the second cover in a direction normal to the base of the box. Complementary projections 178 extend from the inner surface of the second cover and are arranged to engage the inner surface of the portion of the lid of the first cover that projects past the separator. When the projections of the first and second covers are engaged with the corresponding surface of the, respective, other cover, relative movement in a direction normal to the base of the box is prevented by the interlocking surfaces. However, the cover portions can be separated by relative translation parallel to their inner surfaces and can be rotated, in one direction, relative to each other. With the first cover 104 secured to the box, the second cover is installed by holding the cover at an angle relative to the edge 114 of the wall and sliding the cover along the edge of the wall until the edge of second cover abuts the edge of the first cover. When the distal edge of the second cover is rotated toward engagement with the edge of the wall, the complementary interlocking surfaces proximate the abutting edges of the first and second cover secure the abutting edges of the two covers.

As the second edge of the second cover is pressed toward engagement with the edge of the wall, a hook 180 attached to the second cover by a flexible member 182 makes contact with the inner surface of the wall. As the cover is pressed toward engagement with the wall, the flexible member deflects as result of the interference of the hook and the wall. When the inner surface of the second cover has been pressed into engagement with the edge of the wall, the hook portion extends past the side of an aperture 184 defined by the wall and the flexible member elastically rebounds. A surface of the hook engages the edge of the aperture securing the second cover to the box. The hook may be released, to remove the second cover, by inserting a tool, for example the blade of a screwdriver, between the flexible member and the inner surface of the wall to deflect the flexible member and disengage the hook from the wall. The second cover is secured to the box by the combination of the hook and the interlocking surfaces at the abutting edge of the first cover. If the cover is not installed on the box, the second cover cannot be secured to the box making it easy to determine by inspection whether the cover multi-voltage housing has been completely installed.

The improved multi-voltage housing comprises separate covers for the higher voltage and lower voltage components installed in the housing. The cover for the higher voltage components is independently securable to the box portion of the housing and includes an integral separator portion providing a secure enclosure for the contents of the housing that are connected to the higher voltage while enabling access to the contents that are connected to a lower voltage.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A housing for an electrical apparatus, said housing comprising:
   (a) a box comprising a wall defining a perimeter of an opening and extending for a depth from an edge of said wall to a base having an interior surface substantially coextensive with said opening and an exterior surface;
   (b) a first cover comprising:
      (i) a lid portion substantially coextensive with a first portion of said opening and including a first surface engageable with said edge of said wall and a catch surface engageable with a portion of said wall defining a catch aperture; and
      (ii) a separator portion projecting substantially normal to said lid portion to divide said opening for a portion of said depth when said first surface of said lid portion is engaged with said edge of said wall and securable to said base with a screw engaging said exterior surface of said base and in threaded engagement with said separator portion; and
   (c) a second cover securable to said box and including a first surface engageable with said edge of said wall and substantially coextensive with a second portion of said opening.

2. The housing of claim 1 wherein said second cover further comprises a hook surface arranged to engage a portion of said wall defining an aperture, said hook surface elastically urged into engagement with said wall.

3. The housing of claim 1 wherein a portion of said edge of said wall defines an embrasure arranged to engageably receive an electrical device, said electrical device restrained in said embrasure by securement of said first cover to said box.

4. The housing of claim 1 wherein said lid portion of said first cover comprises portions defining at least two apertures arranged to respectively receive an illuminable indicator, said apertures having peripheries differing in shape.

5. The housing of claim 1 wherein said base further comprises a ridge projecting from said interior surface and extending substantially across said opening in a direction substantially parallel to said separator portion, said separator portion spaced apart from said ridge when said first cover is secured to said box.

6. A housing for an electrical apparatus, said housing comprising:
   (a) a box comprising a wall defining an opening extending for a depth from an edge of said wall to a base having an interior surface substantially coextensive with said opening and an exterior surface, a ridge projecting from said interior surface and extending substantially across said opening;
   (b) a first cover securable to said box and comprising a lid portion engageable with said edge of said wall to substantially cover a first portion of said opening and a separator projecting from said lid portion to divide said opening for a portion of said depth, said separator extending substantially parallel to and spaced apart from said ridge when said first cover is secured to said box; and
   (c) a second cover engageable with said edge of said wall and securable to said box to substantially cover a second portion of said opening.

7. The housing of claim 6 wherein said first cover is securable to said box independent of securement of said second cover.

8. The housing of claim 6 wherein said separator of said first cover is securable to said base of said box.

9. The housing of claim 6 wherein said separator of said first cover is securable to said base by a securement apparatus inaccessible from said opening of said box.

10. The housing of claim 9 wherein said securement apparatus comprises a screw including a first portion engageable said exterior surface of said base and a second portion arranged for threaded engagement with said separator of said first cover.

11. The housing of claim 6 wherein securement of said second cover to said box requires prior securement of said first cover to said box.

12. The housing of claim 6 wherein a portion of said edge of said wall defines an embrasure arranged to engageably receive an electrical device, said electrical device restrained in said embrasure by securement of said first cover to said box.

13. The housing of claim 6 wherein said lid portion of said first cover comprises portions defining at least two apertures arranged to respectively receive an illuminable indicator, said apertures having peripheries differing in shape.

14. A housing for an electrical apparatus, said housing comprising:
   (a) a box comprising a wall defining an opening extending for a depth from an edge of said wall to a base having an interior surface substantially coextensive with said opening and an exterior surface;
   (b) a first cover comprising:
      (i) a lid portion including a first surface engageable with said edge of said wall and substantially coextensive with a first portion of said opening and a catch surface engageable with a portion of said wall defining a catch aperture; and
      (ii) a separator projecting substantially normal to said lid portion to divide said opening for a portion of said depth when said first surface of said lid portion is engaged with said edge of said wall, said separator securable to said base by engagement of a hook surface with an engaging surface portion of said base, said hook surface affixed to said separator and elastically urged into engagement with said engaging surface portion of said base; and
   (c) a second cover securable to said box and including a first surface engageable with said edge of said wall and substantially coextensive with a second portion of said opening.

15. The housing of claim 14 wherein said second cover further comprises a second surface engageable with said first surface of said first cover and said separator further comprises a support surface engageable with said first surface of said second cover, respective engagement of said surfaces resisting translation of said second cover relative to said first cover in a direction normal to said first surface of said first cover but enabling said first and said second covers to be separated by translation parallel to said first surface of said first cover.

16. The housing of claim 14 wherein said second cover further comprises a hook surface arranged to engage a portion of said wall defining an aperture, said hook surface elastically urged into engagement with said wall.

17. The housing of claim 14 wherein said base further comprises a ridge projecting from said interior surface and extending substantially across said opening in a direction substantially parallel to said separator, said separator spaced apart from said ridge when said first cover is secured to said box.

* * * * *

UNITED STATES PATENT AND TRADEMARK OFFICE
CERTIFICATE OF CORRECTION

| | | |
|---|---|---|
| PATENT NO. | : 7,968,806 B2 | Page 1 of 1 |
| APPLICATION NO. | : 12/220409 | |
| DATED | : June 28, 2011 | |
| INVENTOR(S) | : Marc Shelton et al. | |

It is certified that error appears in the above-identified patent and that said Letters Patent is hereby corrected as shown below:

<u>Col. 8, line 58</u>

Change "wall$_s$" to read: --wall,--.

Signed and Sealed this
Fourteenth Day of February, 2012

David J. Kappos
*Director of the United States Patent and Trademark Office*